United States Patent
Kikuchi et al.

(10) Patent No.: US 7,056,797 B2
(45) Date of Patent: Jun. 6, 2006

(54) SEMICONDUCTOR DEVICE AND METHOD OF MANUFACTURING THE SAME

(75) Inventors: Shuichi Kikuchi, Gunma (JP); Eiji Nishibe, Gunma (JP); Takuya Suzuki, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/829,876

(22) Filed: Apr. 10, 2001

(65) Prior Publication Data

US 2002/0093065 A1 Jul. 18, 2002

(30) Foreign Application Priority Data

Jan. 16, 2001 (JP) ............... P.2001-008019

(51) Int. Cl.
*H01L 21/336* (2006.01)
(52) U.S. Cl. .............. 438/301; 438/289; 438/286
(58) Field of Classification Search ................ 438/286, 438/289, 294, 295, 299, 301, 302–307; 257/368, 257/328, 335
See application file for complete search history.

(56) References Cited

U.S. PATENT DOCUMENTS

| | | | |
|---|---|---|---|
| 5,303,184 A | | 4/1994 | Noda |
| 5,578,514 A | * | 11/1996 | Kwon et al. .............. 437/41 |
| 5,846,866 A | | 12/1998 | Huang et al. |
| 6,025,231 A | * | 2/2000 | Hutter et al. ............. 438/268 |
| 6,063,674 A | * | 5/2000 | Yang et al. .............. 438/286 |
| 6,117,738 A | * | 9/2000 | Tung ....................... 438/286 |
| 6,207,518 B1 | * | 3/2001 | Akaishi et al. ........... 438/301 |
| 6,258,674 B1 | * | 7/2001 | Kwon et al. .............. 438/286 |

FOREIGN PATENT DOCUMENTS

| | | |
|---|---|---|
| JP | 11-121742 | 4/1999 |
| KR | 9215640 A | 8/1992 |
| KR | 1998-069876 | 10/1998 |
| TW | 371374 | 10/1999 |

OTHER PUBLICATIONS

Stephen A. Campbell, The Science and Engineering of Microelectronic Fabrication, 1996, Oxford University Press, Inc., pp. 49-50.*

* cited by examiner

*Primary Examiner*—Douglas W Owens
(74) *Attorney, Agent, or Firm*—Fish & Richardson P.C.

(57) ABSTRACT

A semiconductor device has a gate electrode formed extending on a first and second gate insulation films formed on P type semiconductor substrate, an N+ type source region adjacent to one end of the gate electrode, an N− type drain region facing said source region through a channel region, having high impurity concentration peak at a position of the predetermined depth at least in said substrate under said first gate insulation film, and formed so that high impurity concentration becomes low at a region near surface of the substrate, an N− type drain region formed so as to range to the N− type drain region, an N+ type drain region separated from the other end of said gate electrode and included in said N− type drain region, and an N type layer formed so as to span from one end portion of said first gate insulation film to said N+ type drain region.

21 Claims, 9 Drawing Sheets positive return roop

SEMICONDUCTOR DEVICE AND METHOD OF MANUFACTURING THE SAME

BACKGROUND OF THE INVENTION

1. Fieled of the Invention

The present invention relates to a semiconductor device and a method of manufacturing the device, particularly to technique improving operation sustaining voltage characteristic of high sustaining voltage MOS transistor for high voltage of power source (HV-VDD) used for an LCD driver, an EL driver and so on.

2. Description of the Related Art

A semiconductor device according to the related art will be described below referring a section view of an LDD type high sustaining voltage MOS transistor shown in FIG. 13.

In FIG. 13, a gate electrode 53 is formed on a P type semiconductor substrate (P-Sub) 51 through a gate insulation film 52. An N+ type source region 54 is formed so as to be adjacent to one end of said gate electrode 53, an N− type drain region 56 is formed facing said source region 54 through a channel region and further separated from the other end of the gate electrode 53, and an N+ type drain region 57 is formed so as to be included in an N− type drain region 56.

In the prior art, a low concentration N− type drain region 56 is formed by thermal diffusion of about 1000. to 1100. so as to form a gentle slope and a deep diffusion layer.

However, even with such the construction, voltage between source and drain (BVDS: sustaining voltage at OFF) is high, but sustaining voltage (VSUS: sustaining voltage at ON) being operation sustaining voltage of the voltage is about 30 V at most in the prior art.

A mechanism decreasing the above-mentioned operation sustaining voltage will be described below.

In such the N channel type high sustaining voltage MOS transistor, a horizontal bipolar transistor 60 having the drain region 57 as corrector (N+), the source region 54 as emitter (N+), and the semiconductor substrate 51 as base (P) is formed parasitically as shown in FIG. 14 and FIG. 15. Decreasing of operation sustaining voltage VSUS even if voltage between source and drain BVDS being sustaining voltage at OFF is caused by ON of the parasitical bipolar transistor 60. Thus, operation range of the N channel type high sustaining voltage MOS transistor is limited and operation at all over the range is difficult.

An operation of said bipolar transistor 60 will be described below.

AS shown in FIG. 14, gate voltage (VG)(>Vt: threshold voltage) is added to the gate electrode 53, voltage of a drain electrode (VD)(>>VG) contacting the drain region 57 is added, and a positive feedback loop described later (refer FIG. 16) is formed in the case of ON of the MOS transistor.

That is, (1) avalanche multiplication generates in a depletion layer by electron of a channel region 62 accelerated at a depletion layer near the drain region 57 so as to generate a pair of an electron and a hole. (2) Said hole flows in the substrate (substrate current: ISub) (3) Said substrate current (ISub) generates voltage slope in the semiconductor substrate 51 to raise substrate voltage. (4) Junction between the source region 54 and the substrate 51 is biased to forward direction. (5) Electron is implanted from the source region 54 to the substrate 51. (6) The implanted electron reaches the drain region 57 and further occurs avalanche multiplication.

Thus, by forming the positive feedback of (1) to (6), large current flows in the device so as to break the device.

Therefore, in design of the N channel type high sustaining voltage MOS transistor, conditions of the design are set considering the above-mentioned phenomenon. First, a transistor construction decreasing substrate current (ISub) is adopted because operation sustaining voltage (VSUS) becomes small as substrate current (ISub) becomes large, and second, the conditions are decided so as to decrease substrate current (ISub) at an actually used region.

FIG. 7 is a substrate current (ISub) vs. gate voltage (VG) characteristic view, in the figure, double humps characteristic of substrate current (ISub) at high region in gate voltage (VG) rises about the conventional N channel type high sustaining voltage MOS transistor (shown with a dotted line in the figure). Therefore, operation sustaining voltage (VSUS) is low as shown in drain current (ID) vs. drain voltage (VD) characteristic view of FIG. 8 and a characteristic view showing operation sustaining voltage of FIG. 9.

The double humps characteristic is caused by concentration of electric field by spreading the depletion layer near the N+ drain region at high region in gate voltage (VG).

Although it is considered to increase ion implantation volume (dose) and to rise concentration of N− type drain region as shown in FIG. 9 to improve operation sustaining voltage (VSUS), the conventional semiconductor device is not improved enough in sustaining voltage as shown with white circles. Because concentration of end portion A of the N− type drain region 56 shown in FIG. 13 rises conversely, problems of increase of short channel effect by that depletion layer spreads to the channel region 55 direction, increase of snap back phenomenon by increase of peak value of substrate current (ISub), and further decrease of voltage between source and drain (BVDS) occur. Therefore, there is not effective means improving operation sustaining voltage.

Therefore, an object of the invention is to provide a semiconductor device capable of improving operation sustaining voltage and a method of manufacturing the device.

SUMMARY OF THE INVENTION

A semiconductor device of the invention has a gate electrode formed extending on a first and second gate insulation films formed on first conductive type semiconductor substrate, a second conductive type source region adjacent to one end of said gate electrode, a first low concentration second conductive type drain region formed facing said source region through a channel region, having high impurity concentration peak at a position of the predetermined depth at least in said substrate under said first gate insulation film, and formed so that high impurity concentration becomes low at a region near surface of the substrate, a second concentration second conductive type drain region formed so as to range to the first low concentration second conductive type drain region, and a third concentration second conductive type drain region separated from the other end of said gate electrode and included in said second concentration second conductive type drain region.

Thus, it is possible that the first concentration second-conductive type drain region under the first gate insulation film where the gate electrode is formed lower in high impurity concentration than the second concentration reverse conductive type drain region of an active region and electric field concentration at end portion of the gate electrode through the first gate insulation film is depressed so as to design high sustaining voltage.

A semiconductor device of the invention has high impurity concentration peak at a position of the predetermined depth in said substrate at a region spanning from one end of said first gate insulation film to said third concentration reverse conductive type drain region, and the fourth concentration second conductive type layer is formed so that high impurity concentration becomes low at a region near surface of the substrate.

A method of manufacturing a semiconductor device has process for ion-implanting a second conductive type impurity in the predetermined region of first conductive type semiconductor substrate, process for forming a first gate insulation film field-oxidizing the predetermined region of said substrate, forming a first concentration second-conductive type drain region under the first gate insulation film diffusing said impurity ion-implanted, and forming a second concentration second conductive type drain region so as to range to the first concentration second-conductive type drain region, process for forming a gate electrode so as to span from the first gate insulation film to the second gate insulation film after forming the second gate insulation film on said substrate except said first gate insulation film, and process for forming a second conductive type source region so as to be adjacent to one end of said gate electrode, and forming a third concentration second conductive type drain region facing said source region through a channel region, separated from the other end of said gate electrode, and included in said second concentration second conductive type drain region. It should be noted that the conductivity of a second conductive type is opposite to the conductivity of the first conductive type. For example, a first conductive type can be a P type and a second conductivity type can be N type.

A method of manufacturing a semiconductor device has process for forming the fourth concentration second conductive type layer so as to span from one end portion of said first gate insulation film to said third concentration second conductive type drain region after forming said third concentration second conductive type drain region.

A method of manufacturing a semiconductor device has process for forming a fourth concentration reverse conductive type layer having high impurity concentration peak at a position of the predetermined depth in said substrate at a region spanning from a position having the predetermined space from one end portion of said first gate insulation film to said third concentration reverse conductive type drain region, and is formed so that high impurity concentration becomes low at a region near surface of the substrate after forming said third concentration reverse conductive type drain region.

A method of manufacturing a semiconductor device has said forming process of the fourth concentration second conductive type layer wherein phosphorus ion is ion-implanted with high acceleration energy of about 100 KeV to 200 KeV.

A method of manufacturing a semiconductor device has said forming process of the fourth concentration second conductive type layer wherein ion implantation is carried out at a region spanning from a position separated the predetermined space from said first gate insulation film to said third concentration second conductive type drain region masking a photo-resist.

A method of manufacturing a semiconductor device has said forming process of the fourth concentration second conductive type layer wherein ion implantation is carried out at a region spanning from a position separated the predetermined space from the first gate insulation film to said third concentration second conductive type drain region masking a side wall insulation film formed at a side wall portion of said first gate insulating film.

A method of manufacturing a semiconductor device has said forming process of the fourth concentration second conductive type layer wherein said fourth concentration second conductive type layer is formed at a region spanning from a position separated the predetermined space from the first gate insulation film to said third concentration second conductive type drain region by ion implantation from oblique upper side of the first gate insulation film masking said gate insulation film.

A method of manufacturing a semiconductor device has said forming process of the fourth concentration second conductive type layer wherein said fourth concentration second conductive type layer is formed at a region spanning from a position separated the predetermined space from the first gate insulation film to said third concentration second conductive type drain region by ion-implanting from oblique upper side of the first gate insulation film masking a photo-resist formed so as to cover said first gate insulation film.

DETAILED DESCRIPTION OF THE PREFERRED EMBODIMENTS

Embodiments of a semiconductor device and a method of manufacturing the same of the invention will be described below referring figures.

Figure 4:
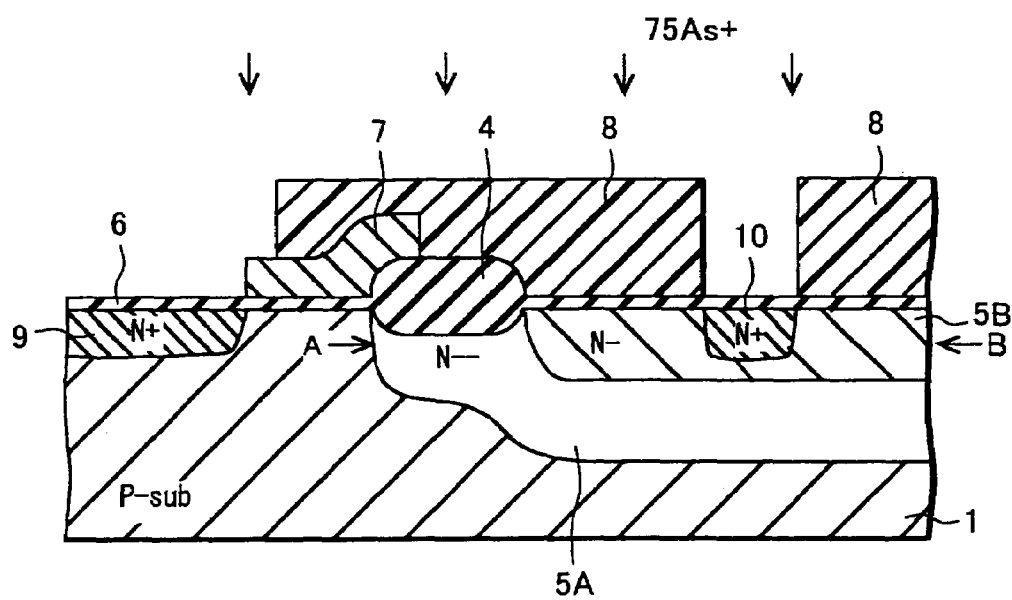
FIG. 4 is a fourth section view showing a method of manufacturing a semiconductor device of a first embodiment of the present invention.

In a semiconductor device of a first embodiment according to the invention, a first gate insulation film 4 and a second gate insulation film 6 are formed on first conductive type semiconductor substrate, for example, P type semiconductor substrate (P-SuB) 1, and a first gate insulation 4 is formed so as to span from the first gate insulation film 4 to the second gate insulation film 6 as FIG. 4. A high concentration second conductive (N+) type source region 9 is formed so as to be adjacent to one end of said first gate insulation 4, a first low concentration second conductive (N−) type drain region 5A is formed so as to face said source region 9 through a channel region under the first gate insulation 4, a second low concentration second conductive (N−) type drain region 5B is formed so as to range to the first low concentration second conductive (N−) type drain region 5A, and further, a high (third) concentration second conductive (N+) type drain region 10 is formed so as to be separated from the other end of said first gate insulation 4 and included in said second low concentration N− type drain region 5B.

Thus, a low concentration second conductive type drain region 5 is formed so as to be high in high impurity concentration from the end of the first gate insulation 4 to said third concentration second conductive (N+) type drain region 10. That is, the low concentration second conductive type drain region 5 is formed so that high impurity concentration becomes high from the first low concentration second conductive (N−) type drain region 5A to the second low concentration second conductive (N−) type drain region 5B.

A method of manufacturing the above-mentioned semiconductor device will be described below.

Figure 1:
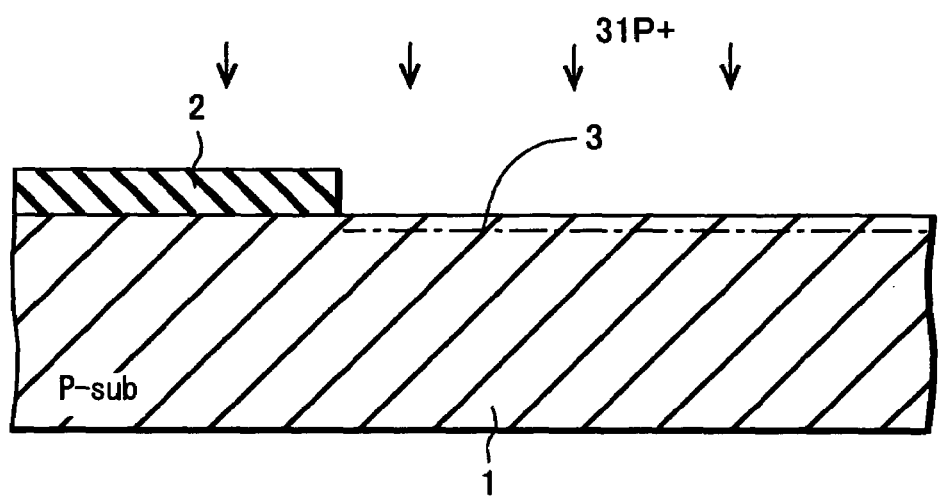
FIG. 1 is a first section view showing a method of manufacturing a semiconductor device of a first embodiment of the present invention.
Figure 2:
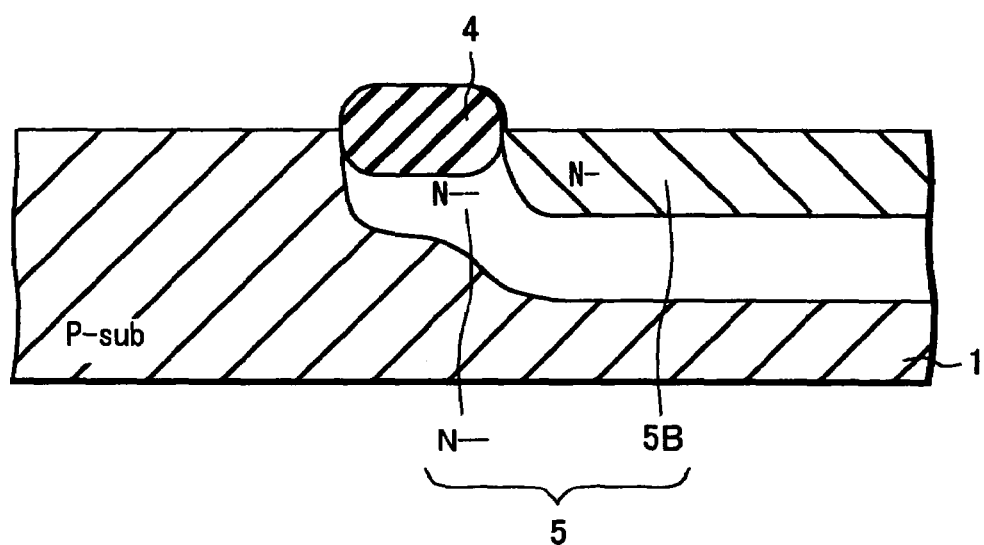
FIG. 2 is a second section view showing a method of manufacturing a semiconductor device of a first embodiment of the present invention.

First, an ion implantation layer 3 is formed by ion-implanting N type impurity on a drain forming region on a P type semiconductor substrate 1 masking a photo-resist 2 as shown in FIG. 1. In the process, as the N type impurity, phosphorus ion ($^{31}P^+$) for example is ion-implanted with about 100 KeV in acceleration voltage and $4 \times 10^{12}/cm^2$ to $6 \times 10^{12}/cm^2$ ($6 \times 10^{12}/cm^2$ in the embodiment) in implantation dose Next, by field oxidation of the predetermined region of the substrate 1, a first gate insulation film 4 consisting of a field oxidation film of 800 nm thickness is formed as shown in FIG. 2. In the process, the field oxidation film is formed by field oxidation of about 1000, 1 hour in $N_a$ atmosphere and 5 hours in $O_a$ atmosphere.

Next, in the process, phosphorus ion in said ion implantation layer 3 is diffused, the first low concentration second conductive (N−) type drain region 5A is formed under said first gate insulation film 4, and the second low concentration second conductive (N−) type drain region 5B is formed so as to range to the first low concentration second conductive (N−) type drain region 5A.

Here, the semiconductor of the invention is characterized in ion-implanting for forming an N type drain region before forming the field oxidation film and letting between under the field oxidation film (the first gate insulation film 4) and an active region have impurity distribution.

That is, a low concentration N type drain region 5 is formed at a region including under the first gate insulation film 4 formed by well-known LOCOS (Local oxidation of silicon) as shown in FIG. 2. The under part of the first gate insulation film 4 of the drain region 5 is formed low in impurity comparing with other region in the drain region 5. First, by field oxidation after ion-implanting phosphorus ion ($^{31}P^+$) into a forming region of said drain region 5 with $4 \times 10^{12}/cm^2$ to $6 \times 10^{12}/cm^2$ in implantation dose as above-mentioned, phosphorus ion ($^{31}P^+$) is taken in the first gate insulation film 4 at growth region of said first gate insulation film 4 at oxidation, the low concentration N− type drain region 5A is formed under the first gate insulation film 4, and the N− type drain region 5B rather higher in impurity than the N− type drain region 5A is formed so as to range to the N− type drain region 5A (the other end of the first gate).

As described above, by field oxidation after ion-implanting phosphorus ion ($^{31}P^+$) at the forming region of said drain region 5 and ion-implanting the P type impurity for forming the channel stopper layer under the forming region of the first gate insulation film 4, The phosphorus ion ($^{31}P^+$) is taken in the first gate insulation film 4 at the growth part of said gate insulation film 4 at oxidation. By ion-implanting a second conductive P type impurity to phosphorus ion (for example, boron ion ($^{11}B^+$), the low concentration N− type drain region is formed under the first gate insulation film 4. Further, since the process uses ion implantation process of the P type impurity for forming the channel stopper layer, number of manufacturing process is not decreased and operation efficiency is good.

Figure 3:
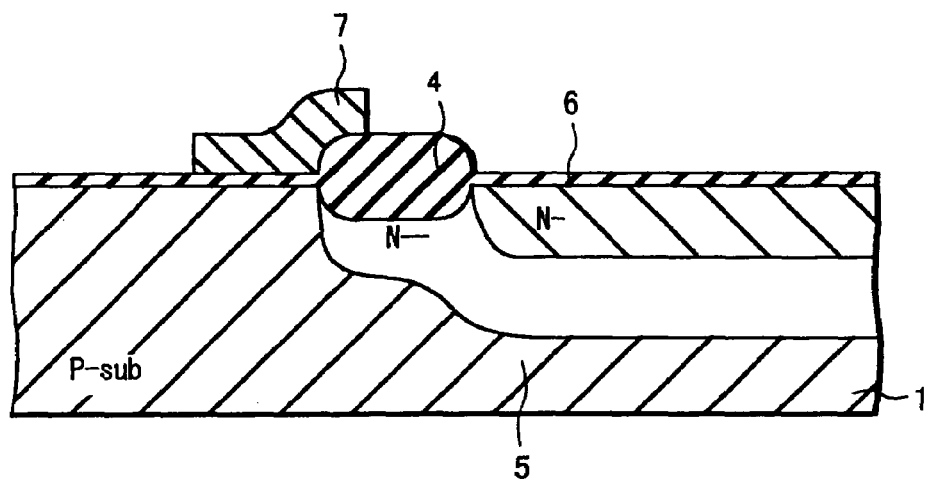
FIG. 3 is a third section view showing a method of manufacturing a semiconductor device of a first embodiment of the present invention.

As shown in FIG. 3, by forming a conductive film, for example, a polysilicon film at the entire surface after forming the second gate insulation film 6 of about 100 nm thickness carrying out thermal oxidation at region except the first gate insulation film 4 on said substrate 1 and by patterning the polysilicon film using well-known patterning technique, the gate electrode 7 of 400 nm in thickness is formed so as to span from said first gate insulation film 4 to the second gate insulation film 6.

As shown in FIG. 4, arsenic ion ($^{75}As^+$) for example is ion-implanted on the predetermined region on a source forming region and said low concentration drain region 5 with 80 KeV in acceleration voltage and about $6 \times 10^{15}/cm^2$ in implantation dose masking a photo-resist 8 having openings. A high concentration N+ type source region 9 is formed so as to be adjacent to one end of said gate first gate insulation 4, and a high (third) concentration N+ type drain region 10 separated from the other end of the first gate insulation 4 and included in said low concentration (n−) type drain region 5B is formed.

Figure 5:
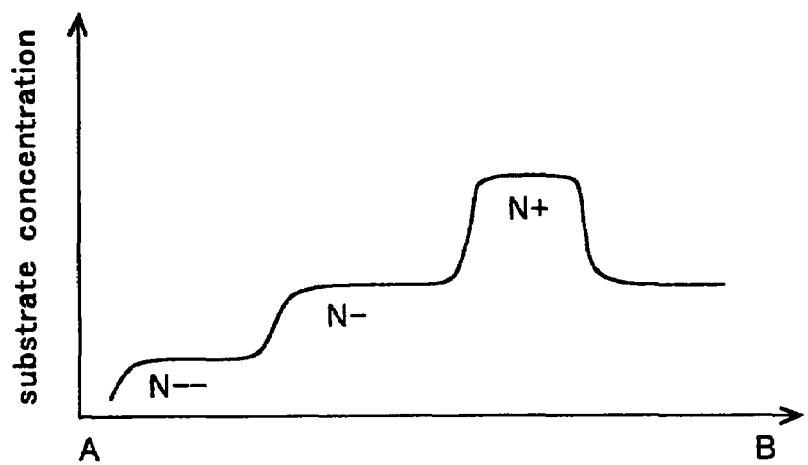
FIG. 5 is a view showing substrate concentration distribution of the semiconductor device of the first embodiment of the present invention.

In concentration distribution of the semiconductor device formed as above, as shown in FIG. 5, concentration rises gradually from a drain end portion A of a channel side to the N+ type drain region 10. As concentration of the end portion A of the low concentration N type drain region 5 becomes low (concentration of the N− type drain region 5A becomes lower than concentration of the N− type drain region 5B), voltage between source and drain (BVDS) is maintained and operation sustaining voltage (VSUS) is improved.

Thus, by ion-implanting for forming low concentration drain region before field oxidation, the low concentration N type drain region 5 having concentration distribution at under part of the first gate insulation film 4 and the active region is formed so that operation efficiency is good.

An another embodiment of the invention will be described.

Figure 6:
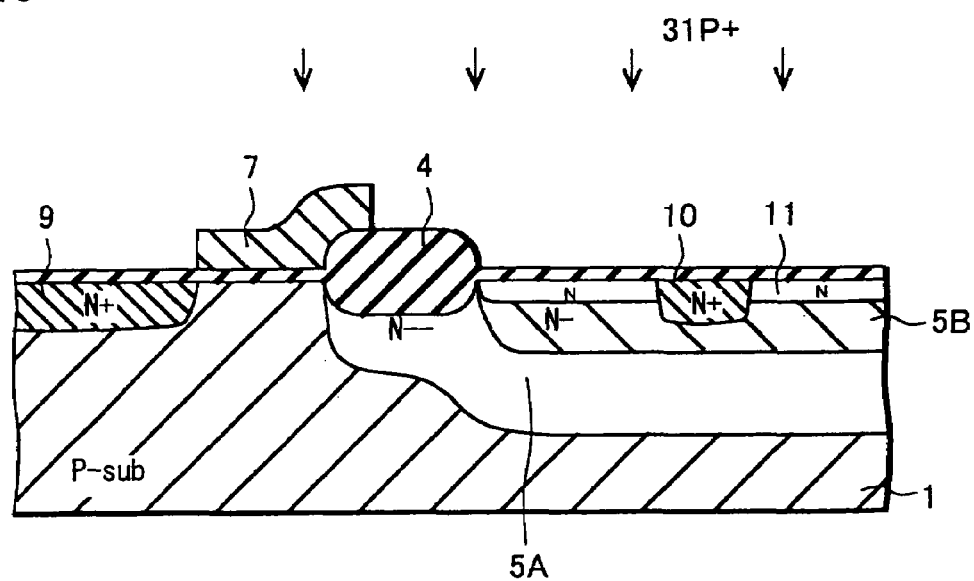
FIG. 6 is a section view showing a method of manufacturing a semiconductor device of a second embodiment of the present invention.

First, the second embodiment is useful in case to raise more operation sustaining voltage (VSUS) in the semiconductor device of the above-mentioned first embodiment. As shown in FIG. 6, by forming an N type layer 11 which is lower in concentration than the N+ type drain region 10 and higher than said N− type drain region 5B (so called middle concentration) so as to surround the N+ type drain region 10, operation sustaining voltage (VSUS) is further improved.

In the method of manufacturing the semiconductor device of the embodiment, by ion-implanting phosphorus ion ($^{31}P^+$) into a forming region of said drain region 5 with about 160 KeV in acceleration voltage and about $2 \times 10^{12}/cm^2$ in implantation dose as shown in FIG. 6 after the method of manufacturing the semiconductor device of the above-mentioned first embodiment (processes of FIG. 1 to FIG. 4), the N type layer 11 is formed.

Figure 7:
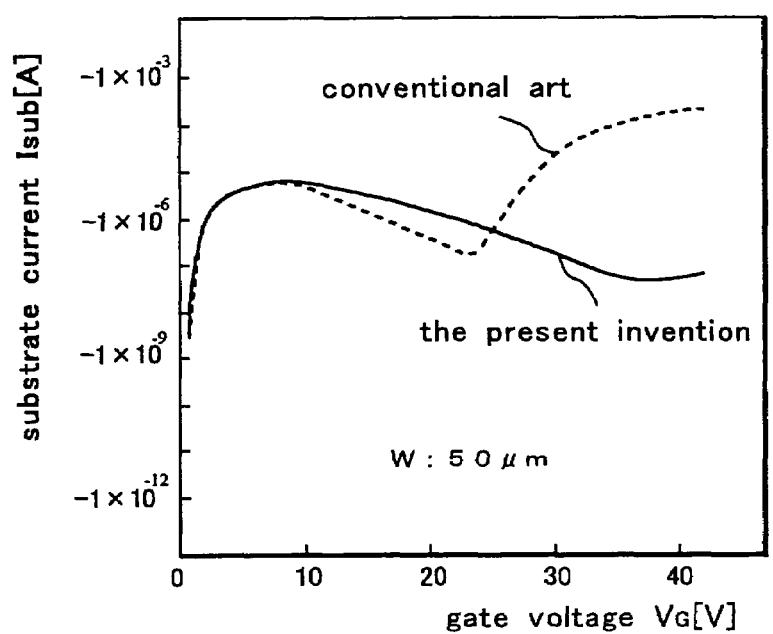
FIG. 7 is a view showing substrate current (ISub) vs. gate voltage (VG) of a semiconductor device of the invention and the conventional semiconductor device.
Figure 8:
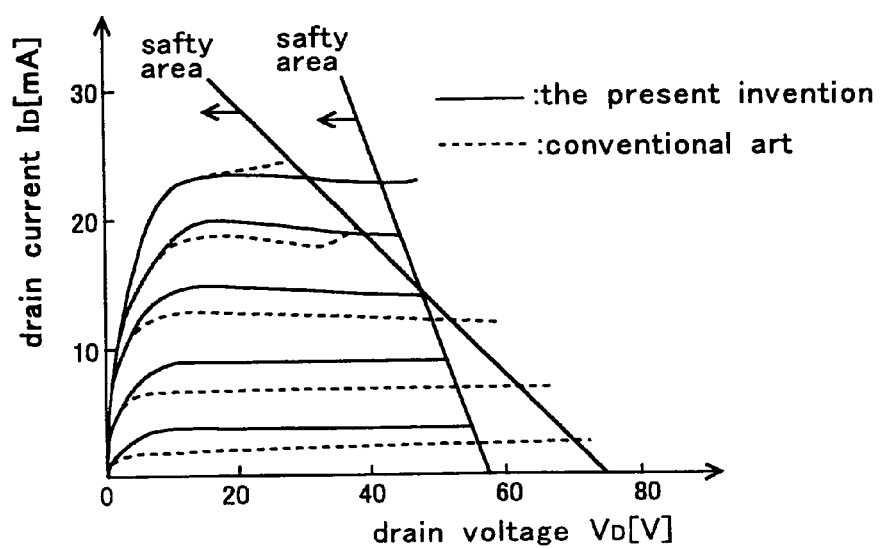
FIG. 8 is a view showing drain current (ID) vs. drain voltage (VD) of a semiconductor device of the invention and the conventional semiconductor device.
Figure 9:
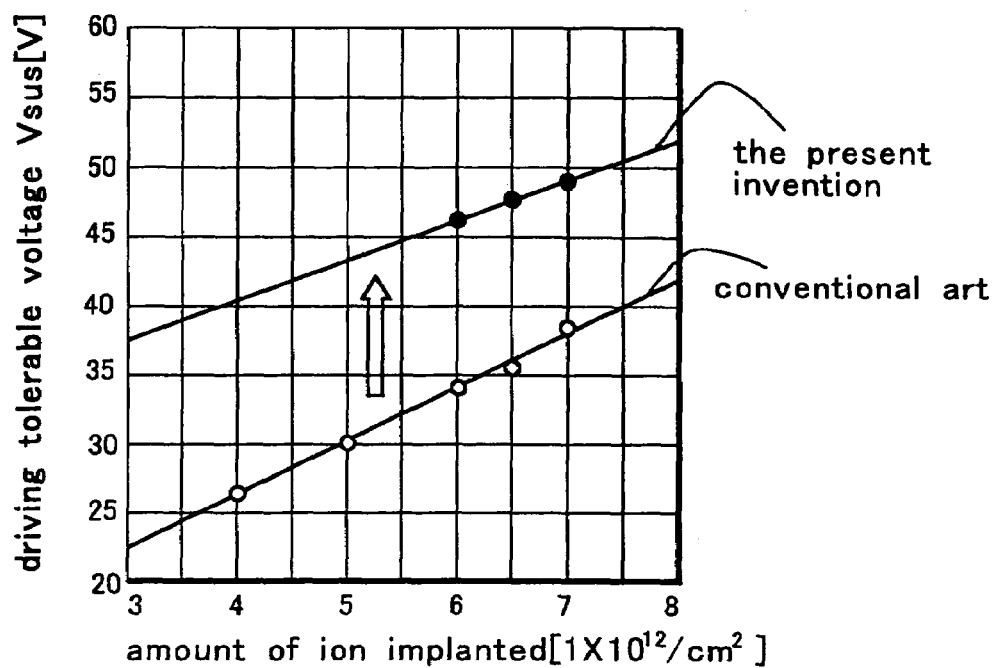
FIG. 9 is a view showing operation sustaining voltage of a semiconductor device of the invention and the conventional semiconductor device.

By the process, the N+ type drain region 10 is surrounded by the above-mentioned N type layer 11 maintaining concentration of channel side drain region end portion low concentration by the N− type drain region 5A. AS described above, by surrounding said high concentration N+drain region 10 with the middle concentration N type layer 11 and by letting depletion layer not extend to the N+ type drain region, the semiconductor device of the invention removes double humps characteristic and can decrease substrate current (ISub) at high gate voltage (VG) region as shown with a solid line in FIG. 7. Thus, operation sustaining voltage (VSUS) improves as shown in FIG. 8 and FIG. 9. Especially, sustaining voltage improves extremely at high gate voltage (VG) and high drain current (ID).

Next, a third embodiment of the invention will be described.

Figure 10:
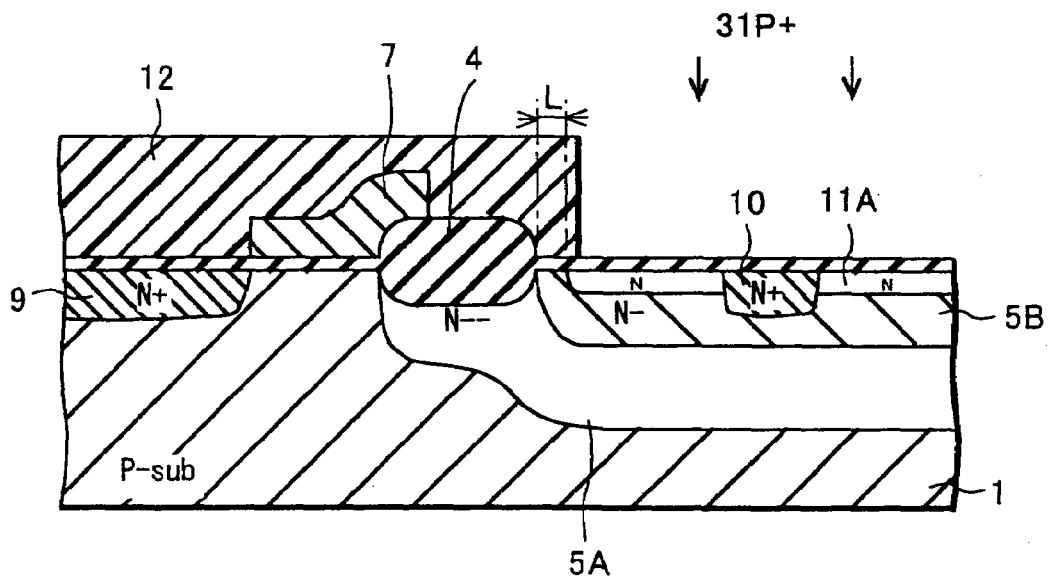
FIG. 10 is a section view showing a method of manufacturing a semiconductor device of a third embodiment of the present invention.

The characteristic of the semiconductor device of the third embodiment is that a middle concentration N type layer 11A is formed having the predetermined space (L) from one end portion (drain side) of the first gate insulation film 4 through said first gate insulation film 4 as shown in FIG. 10. Since electric field concentration at the end portion of the first gate electrode 7 by forming the N type layer 11A having the predetermined space (L) from one end portion the gate gate electrode 7, higher sustaining voltage is designed.

In the above-mentioned method of manufacturing the semiconductor device, in the process of FIG. 6 described at the above-mentioned second embodiment, a middle concentration N type layer 11A is formed near the N+ type drain region 10 included in said N− type drain region having the predetermined space (L) from one end portion of said first gate insulation 4 as shown in FIG. 10 by ion-implanting phosphorus ion ($^{31}P^+$), for example, with about 160 KeV in acceleration voltage and about $2 \times 10^{12}/cm^2$ in implantation dose forming a photo-resist 12 so as to overlap with the predetermined space from the one end portion (drain side) of the gate electrode. Therefore, a space from the first gate insulation 4 (L) can be set freely by adjusting overlap quantity to the gate electrode 7 through the first gate insulation film 4 at forming the photo-resist 12.

An another embodiment forming the above-mentioned middle concentration N type layer having the predetermined space from one end (drain side) of the gate electrode 7 through the above-mentioned first gate insulation film 4 will be described.

Figure 11:
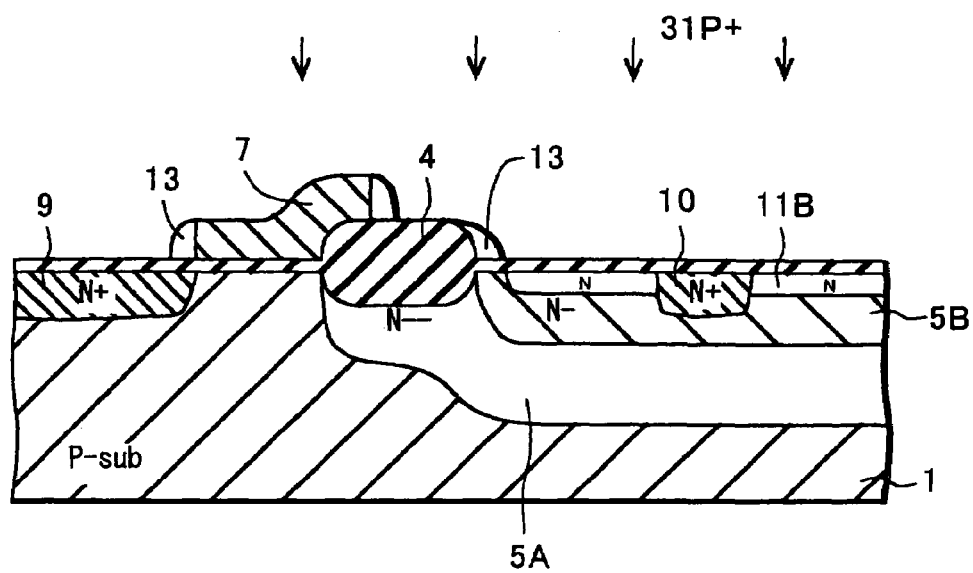
FIG. 11 is a section view showing a method of manufacturing a semiconductor device of a fourth embodiment of the present invention.

First,—in a fourth embodiment, the above-mentioned construction is realized by forming a side wall insulation film 13 so as to cover a side wall portion of the first gate insulation film 4 ion-implanting for forming N type layer masking a side wall insulation film 13 as shown in FIG. 11.

That is, after process of FIG. 4 described in the first embodiment, an insulation film is formed by CVD method. After that, the side wall insulation film 13 is formed at a first gate insulation film 4 and a side wall portion of the first gate insulation film 4 by isotropic etching the insulation film.

Then, a middle concentration N type layer 11B is formed near the N+ type drain region 10 included in said N− type drain region 5B having the predetermined space (L) from the other end portion of said first gate insulation 4 by ion-implanting phosphorus ion ($^{31}P^+$), for example, with about 160 KeV in acceleration voltage and about $2 \times 10^{12}/cm^2$ in implantation dose masking said first gate insulation film 4 and the side wall insulation film 13.

Thus, in the fourth embodiment, since the side wall insulation film 13 formed at the side wall portion of the first gate insulation film 4 instead of the photo-resist 12 such as the second embodiment is used for a part of a mask, positioning margin of forming the N type layer to the gap of mask matching worried at using the photo-resist 12 can be ensured. That is, in the embodiment, a space (L) from the end portion of the first gate insulation 4 to the position forming the N type layer 11B can be adjusted freely by thickness of the insulation film for forming the side wall insulation film.

Further, a fifth embodiment will be described.

Figure 12:
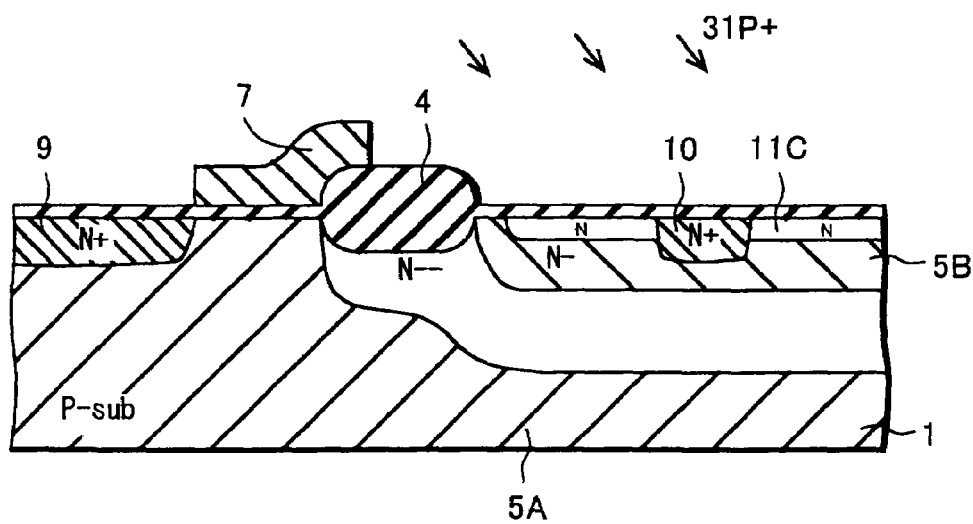
FIG. 12 is a section view showing a method of manufacturing a semiconductor device of a fifth embodiment of the present invention.
Figure 13:
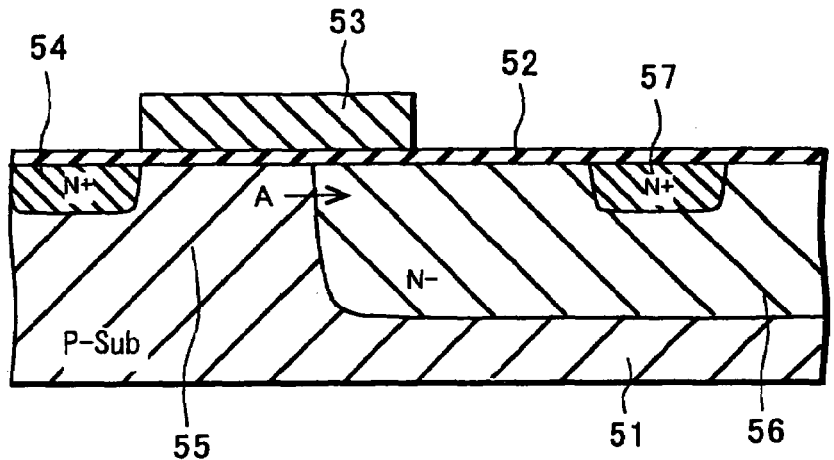
FIG. 13 is a section view showing the conventional semiconductor device.
Figure 14:
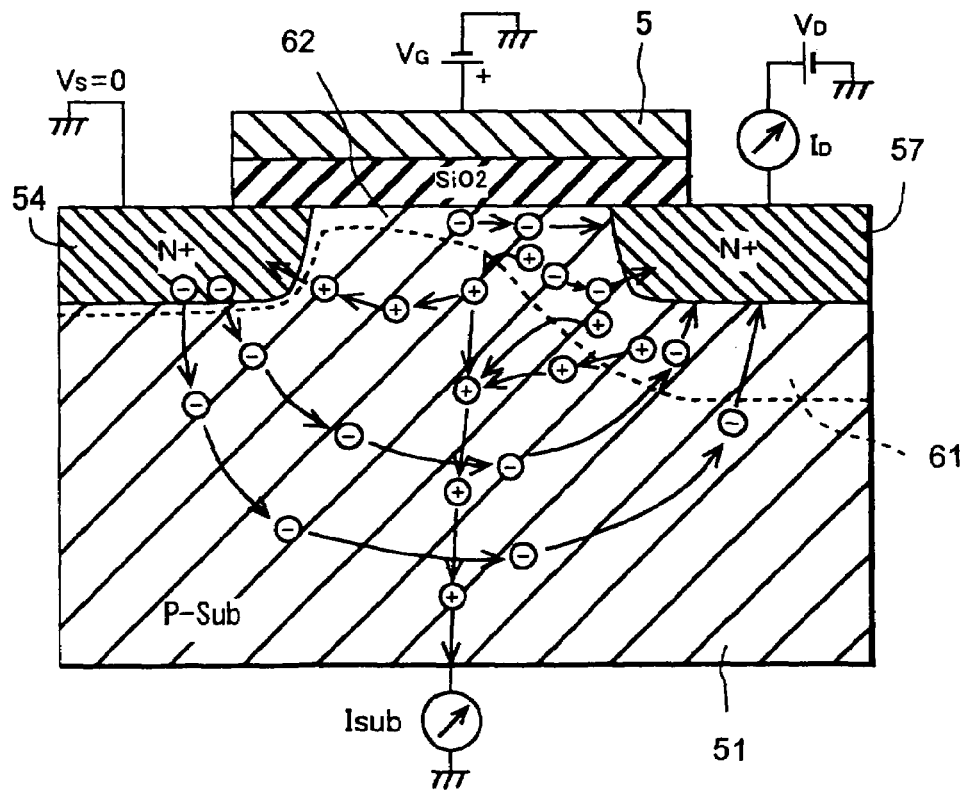
FIG. 14 is a section view of the semiconductor device for describing the mechanism of the conventional operation sustaining voltage drop.
Figure 15:
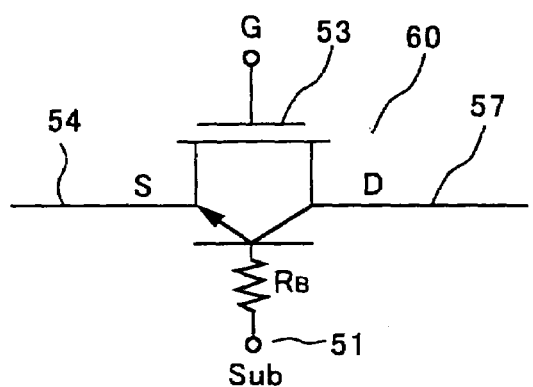
FIG. 15 is a view showing the equivalent circuit of the conventional parasitic bipolar transistor.
Figure 16:
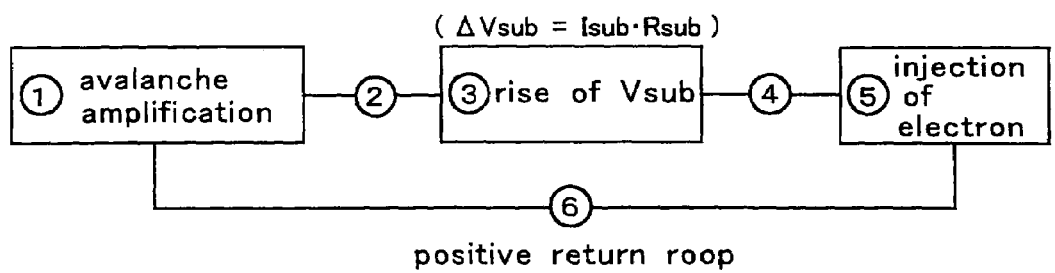
FIG. 16 is a view showing a positive feedback loop for describing the mechanism of the conventional operation sustaining voltage drop.

Here, a characteristic of the fifth embodiment is that the above-mentioned construction is realized by ion implantation for forming the N type layer from oblique upper side of the first gate insulation film 4 masking the first gate insulation film 4 after forming the gate electrode 4 as shown in FIG. 12.

That is, a middle concentration N type layer 11C is formed near the N+ type drain region 10 included in said N− type drain region 5B having the predetermined space (L) from the other end portion of said first gate insulation 4 by ion-implanting phosphorus ion ($^{31}P^+$), for example, with about 160 KeV in acceleration voltage and about $2 \times 10^{12}/cm^2$ in implantation dose from oblique upper side of the first gate insulation film 4 masking the first gate insulation film 4 on the gate insulation film 3 after the process of FIG. 4 described in the first embodiment. At this time, depending on thickness of the first gate insulation film 4, a space (L) from the end portion of the first gate insulation 4 to the position where the N type layer 11C is formed is adjusted freely by adjusting ion adjusting angle from oblique upper side of the first gate insulation film 4 (ion implantation of 30 degrees of oblique angle from vertical direction in the embodiment) freely.

Thus, in the fifth embodiment, the N type layer 7D having the predetermined space (L) from the first gate insulation 4 can be formed by ion implantation from oblique upper side of the first gate insulation film 4, and number of manufacturing processes can be decreased comparing with manufacturing method using the photo-resists PR2 and the side wall insulation film 13. Moreover, a space (L) from the end portion of the first gate insulation 4 to the position where the N type layer 11C is formed can be adjusted only by adjusting freely ion implantation angle at ion implantation, so that operation efficiency is good.

In the process using such the oblique ion implantation method, ion implantation may be carried out from oblique direction using a photo-resist 12 as the above-mentioned second embodiment though the description shown in a figure is omitted. Further, ion implantation may be carried out from oblique direction using said side wall insulation film 13 as the third embodiment instead of the photo-resist 12.

According to the invention, since the lower concentration second conductive type drain region differ in high impurity concentration between the under part of the gate electrode through the first gate insulation film—and the active region is formed, electric field concentration to the end portion of the gate electrode through the first gate insulation film is controlled so as to improve operation sustaining voltage.

The semiconductor device has high impurity concentration peak at the position of the predetermined depth in the substrate at region where is separated from the other end of the gate electrode and spans to a high concentration second conductive type drain region included in a low concentration second conductive type drain region, and forms a middle concentration second conductive type layer becoming low in high impurity concentration at region near surface of the substrate. Therefore, operation sustaining voltage further improves.

Especially, by forming said middle concentration second conductive type layer at the position separated the predetermined space from the end portion of the gate electrode through said first gate insulation film, higher sustaining voltage becomes possible.

What is claimed is:

1. A method of manufacturing a semiconductor device comprising:
   implanting an impurity of a first conductive type through a substrate surface located above first and second drain formation regions of a semiconductor substrate of a second conductive type, wherein the implantation is a single implantation;
   diffusing the implanted impurity in the substrate by providing a first gate insulation film on the semiconductor substrate by applying a heat treatment, so as to form a first drain region partially under the first gate insulation film and a second drain region adjacent to and above the first drain region, wherein said first drain region is formed in the first drain formation region and has a lower impurity concentration than the second drain region, which is formed in the second drain formation region, wherein the first and second drain regions are formed by a single step of implanting the impurity and a single step of forming the first gate insulation by applying heat treatment;
   providing a second gate insulation film on the semiconductor substrate except where the first gate insulation film is disposed;
   providing a gate electrode that spans from the first gate insulation film to the second gate insulation film;
   providing a source region of the first conductive type disposed proximally to one end of said gate electrode; and
   providing a third drain region of the first conductive type disposed distally from the other end of said gate electrode and disposed in said second drain region wherein the third drain region is surrounded by the second drain region.

2. A method of manufacturing a semiconductor device according to claim 1, further comprising:
   providing a layer of the first conductive type to span a predetermined distance from one end of said first gate insulation film to and said third drain region, wherein the layer is disposed over the second drain region.

3. A method of manufacturing a semiconductor device according to claim 1, further comprising:
   forming a layer of the first conductive type having a middle impurity concentration at a predetermined depth in said substrate at a region spanning from a predetermined distance from end of said first gate insulation film to and beyond said third drain region, wherein the layer is disposed over the said drain region.

4. A method of manufacturing a semiconductor device according to claim 2, wherein phosphorus ions are implanted with an energy of about 100 KeV to 200 KeV in the substrate to form the layer.

5. A method of manufacturing a semiconductor device according to claim 3, wherein phosphorus ions are implanted with an energy of about 100 KeV to 200 KeV in the substrate to form th layer.

6. A method of manufacturing a semiconductor device according to claim 2, wherein for forming the layer, ion implantation is carried out in a region spanning from a predetermined space from said first gate insulation film to said third drain region by using a photo-resist as a mask.

7. A method of manufacturing a semiconductor device according to claim 3, wherein or forming the layer, ion implantation is carried out in a region spanning from a predetermined space form the first gate insulation film to said third drain region by using a photo-resist as a mask.

8. A method of manufacturing a semiconductor device according to claim 2, wherein for forming the layer, ion implantation is carried out in a region spanning from a predetermined space from the first gate insulation film to said third drain region by using a side wall insulation film formed adjacent a side wall portion of said first gate insulating film as a mask.

9. A method of manufacturing a semiconductor device according to claim 3, wherein for forming the layer, ion implantation is carried out in a region spanning from a predetermined space from the first gate insulation film to said third drain region by using a side wall insulation film formed adjacent a side wall portion of said first gate insulating film as a mask.

10. A method of manufacturing a semiconductor device according to claim 2, wherein said layer is formed in a region spanning from a predetermined space from the first gate insulation film to said third drain region by using said first gate insulation film as a mask ion-implanting obliquely from an upper side of the first gate insulation film.

11. A method of manufacturing a semiconductor device according to claim 3, wherein said layer is formed in a region spanning from a predetermined space from the first gate insulation film to said third drain region by using said first gate insulation film as a mask and ion-implanting obliquely from an upper side of the first gate insulation film.

12. A method of manufacturing a semiconductor device according to claim 2, wherein said layer is formed in a region spanning from a predetermined space from the first gate insulation film to said third drain region by using a photo-resist formed to cover said first gate insulation film and ion implanting obliquely from above the first gate insulation film.

13. A method of manufacturing a semiconductor device according to claim 3, wherein said layer is formed at a region spanning from a predetermined space from the first gate insulation film to said third drain region by forming a photo-resist formed to cover said first gate insulation film and ion implanting obliquely from above the first gate insulation film.

14. A method of manufacturing a semiconductor device according to claim 1, wherein the source region is in direct contact with the substrate.

15. A method of manufacturing a semiconductor device according to claim 2, wherein the layer of the first conductive type is formed after formation of the third drain region.

16. A method of manufacturing a semiconductor device according to claim 3, wherein the layer of the first conductive type is formed after formation of the third drain region.

17. A method of manufacturing a semiconductor device according to claim 2, wherein the layer of the conductive type is formed through the second gate insulation film.

18. A method of manufacturing a semiconductor device according to claim 3, wherein the layer of the first conductive type is formed through the second gate insulation film.

19. A method of manufacturing a semiconductor device according to claim 2, wherein the layer of the first conductive type has a higher impurity concentration than the first or second drain regions and a lower impurity concentration than the third drain region.

20. A method of manufacturing a semiconductor device according to claim 3, wherein the layer of the first conductive type has a higher impurity concentration than the first or second drain regions and a lower concentration that the third drain region.

21. A method of manufacturing a semiconductor device according to claim 1, wherein the first and second drain formation regions into which the impurity is implanted have different impurity concentrations.

* * * * *